United States Patent [19]
Kato

[11] Patent Number: 6,139,631
[45] Date of Patent: Oct. 31, 2000

[54] CRYSTAL GROWTH METHOD AND APPARATUS

[75] Inventor: Hiroyuki Kato, Yokohama, Japan

[73] Assignee: Stanley Electric Co., Ltd., Tokyo, Japan

[21] Appl. No.: 09/133,084

[22] Filed: Aug. 12, 1998

[30] Foreign Application Priority Data

Sep. 5, 1997 [JP] Japan .................................. 9-241348

[51] Int. Cl.⁷ .......................... C30B 25/00; C30B 35/00
[52] U.S. Cl. .............................. 117/200; 117/84; 117/88; 117/99; 117/100; 117/109; 117/956; 148/DIG. 64
[58] Field of Search ................................ 117/84, 88, 91, 117/97, 100, 109, 200, 956; 148/DIG. 64

[56] References Cited

U.S. PATENT DOCUMENTS

| | | | |
|---|---|---|---|
| 4,155,784 | 5/1979 | Mills et al. ................................. | 117/91 |
| 4,662,981 | 5/1987 | Fujiyasu et al. ........................... | 117/93 |
| 4,869,776 | 9/1989 | Kitagawa et al. .......................... | 117/3 |
| 5,707,446 | 1/1998 | Volkl et al. ............................... | 117/200 |
| 5,858,086 | 1/1999 | Hunter ..................................... | 117/84 |

FOREIGN PATENT DOCUMENTS 8-208365  8/1996  Japan .

*Primary Examiner*—Benjamin L. Utech
*Assistant Examiner*—Donald L. Champagne
*Attorney, Agent, or Firm*—Frishauf, Holtz, Goodman, Langer & Chick, P.C.

[57] ABSTRACT

A crystal growth method having the steps of: preparing a growth container having a vapor generating chamber VC provided with a source material 14, a growth chamber GC provided with a seed crystal 12, and a coupling portion 18 having a cross sectional area narrower than a cross sectional area of each of the vapor generating chamber and the growth chamber, the coupling portion coupling the vapor generating chamber and the growth chamber; and vapor-phase growing a single crystal on the seed crystal by forming a temperature gradient in the growth container and by maintaining the seed crystal in the growth chamber at a growth temperature and the source material in the vapor generating chamber at a vapor supply temperature higher than the growth temperature. A crystal having a diameter larger than that of a seed crystal can be formed easily.

3 Claims, 3 Drawing Sheets

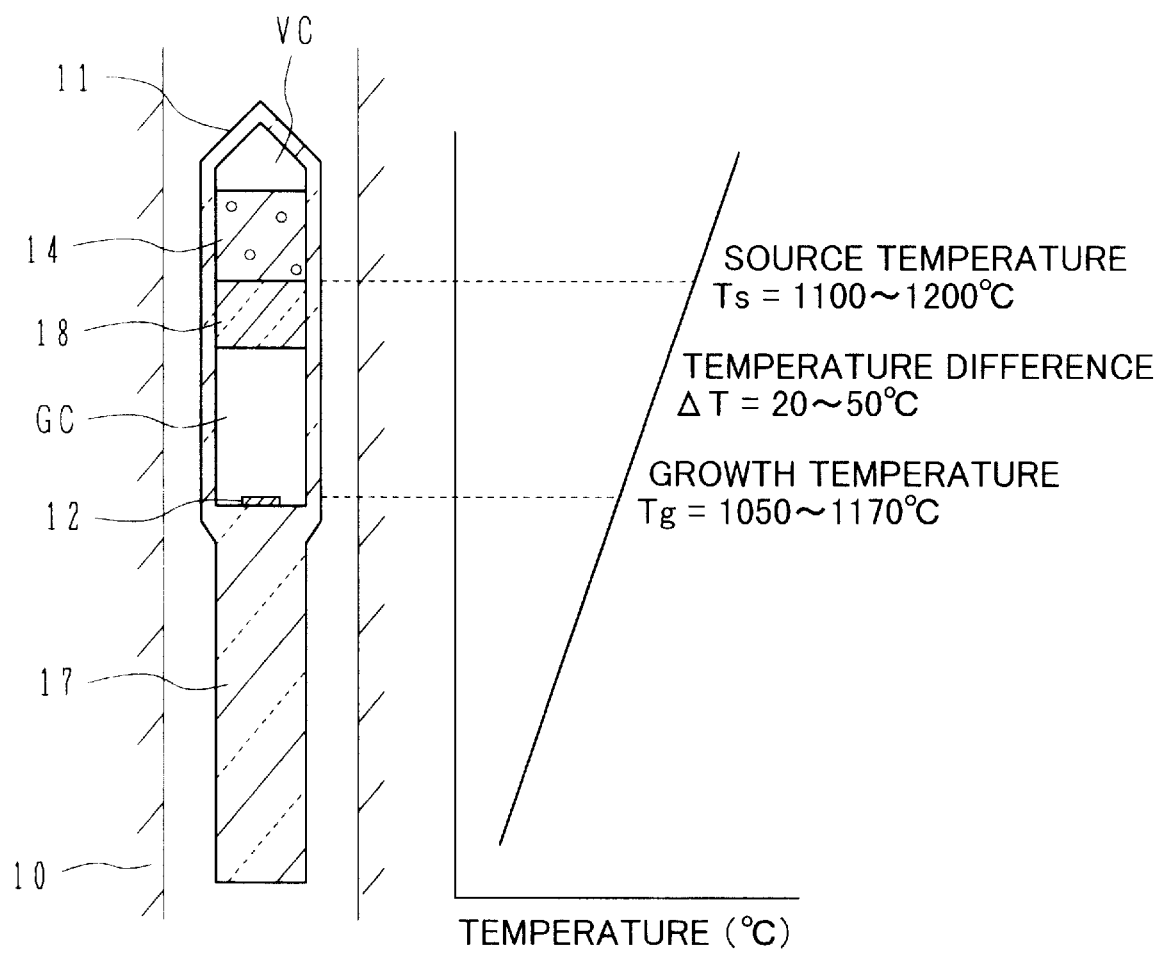

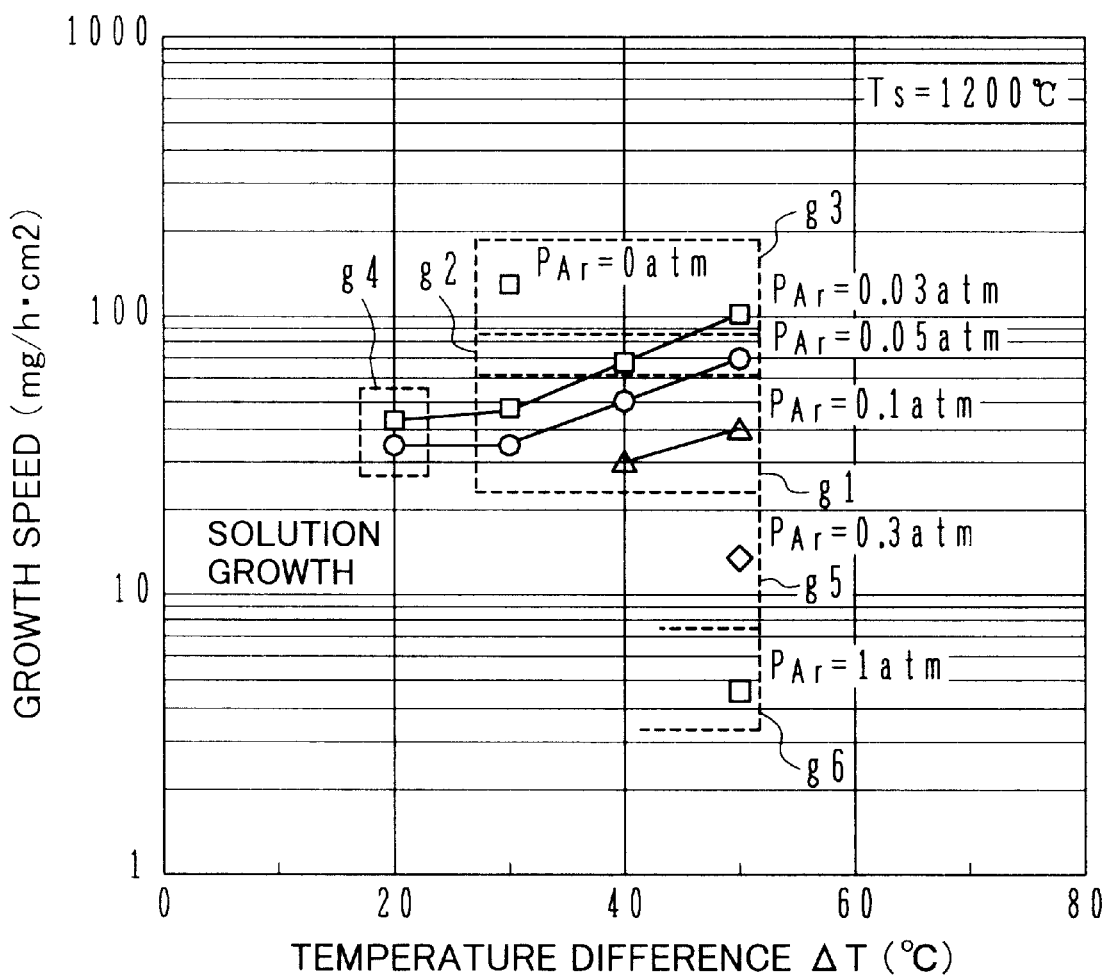

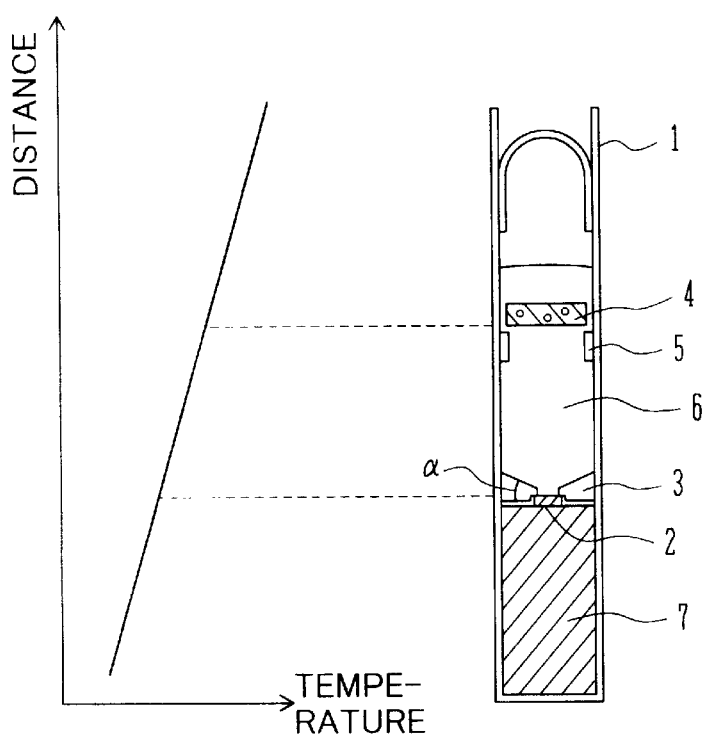
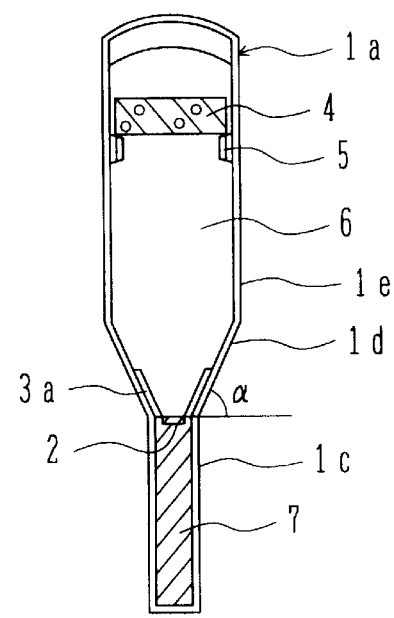
FIG.3A PRIOR ART
FIG.3B PRIOR ART

CRYSTAL GROWTH METHOD AND APPARATUS

This application is based on Japanese Patent Application No. 9-241348 filed on Sep. 5, 1997.

BACKGROUND OF THE INVENTION a) Field of the Invention

The present invention relates to a crystal growth method and apparatus, and more particularly to a crystal growth method and apparatus suitable for crystal growth of a substance having a high vapor pressure near at a melting point, such as a compound semiconductor.

b) Description of the Related Art

Known crystal growth methods include a melted liquid growth (melt growth) method, a solution growth method, a vapor phase growth method and the like. With the melted liquid growth method, a substance for crystal growth is heated to a melting point or higher to form melted liquid, and a seed crystal is brought into contact with the melted liquid or a region having a temperature lower than the melting point is formed, to thus grow a crystal.

With the a solution growth method, substance for crystal growth is dissolved in solvent to form solution, a solubility is lowered through evaporation of the solvent, the temperature falls or the like to form a supersaturated region, and crystal is grown on a seed crystal or the like.

With the vapor phase growth method, a substance for crystal growth or its source material is transported to grow a crystal on a seed crystal or the like. Each of the crystal growth methods has specific characteristics which will be described by taking as an example the crystal growth of a compound semiconductor.

A compound semiconductor of group III–V, II–VI or the like has generally a high vapor pressure near the a melting point or higher. The melted liquid crystal growth method requires a growth container resistant to a high pressure because a vapor pressure above the melted liquid becomes high.

The solution crystal growth method does not require heating to the melting point or higher, and can grow a crystal if a solution is prepared. For example, a vertical container is used as a growth container, and a temperature gradient is formed between the upper and lower regions of the container. A source material is placed in the upper high temperature region of the solution and a seed crystal is placed in the lower low temperature region to grow a single crystal on the seed crystal.

With reference to FIGS. 3A and 3B, a solution crystal growth apparatus and method disclosed in Japanese Patent Laid-open Publication No. 8-208365 filed by the present assignee will be described. This solution crystal growth method grows a bulk single crystal having a larger diameter by using a seed crystal having a smaller diameter.

This method will be detailed by taking as an example a crystal growth of a group II–VI compound semiconductor ZnSe by using a Se—Te solvent. ZnSe is a promising substance for blue light emitting semiconductor elements.

FIG. 3A shows a crystal growth apparatus. The right side in FIG. 3A is a cross sectional view of the crystal growth apparatus and the left side is a graph showing a temperature distribution set in a furnace. A crystal growth container 1 is prepared which is made of a quartz tube having a proper diameter. The surface of the crystal growth container 1 is etched by hydrofluoric acid to clean it.

A heat sink 7 made of a material having a good thermal conductivity such as carbon is placed on the bottom of the crystal growth container 1 with the cleaned surface. After vacuum baking is performed, the heat sink 7 is fixed by shrinking the inner diameter of the crystal growth container 1 or by other means.

As a seed crystal 2, a ZnSe single crystal having the plane (1 1 1) is prepared. A ZnSe single crystal having a plane different from the plane (1 1 1) may be used. After the seed crystal 2 is polished to have a mirror surface, it is washed and etched to have a mirror surface. The prepared seed crystal 2 is placed on the central upper surface of the heat sink 7.

It is preferable to form a recess in the upper surface layer of the heat sink 7 for receiving or accomodating the seed crystal 2 in this recess. In this case, it is also preferable to set the level of the upper surface of the seed crystal 2 higher than the upper surface of the heat sink 7.

In order to fix the seed crystal 2, a seed crystal fixer 3 made of quartz and having a ring shape is placed on the seed crystal 2 and partially fixed to the crystal growth container 1. The ring-shaped seed crystal fixer 3 has a tapered inner surface. The inner diameter at the smaller diameter end of the tapered inner surface is smaller than the diameter of the seed crystal 2, and the inner diameter at the larger diameter end is roughly equal to the inner diameter of the crystal growth container 1.

As shown in FIG. 3A, the ring-shaped seed crystal fixer 3 has a flat bottom surface and a conically tapered upper surface, so that the peripheral region of the fixer 3 is thick and the central region is thin. An angle between the bottom surface and the tapered upper surface is set in a range from an angle of 60° to an angle smaller than 90° or preferably in a range from an angle of 70° to an angle smaller than 80°.

The fixer 3 has a generally flat bottom surface and is formed with a circular step in the central region thereof in order to reliably fix the seed crystal 2. The diameter of the step is generally equal to that of the seed crystal 2 and the height thereof is lower than a height of the seed crystal 2 projecting out of the heat sink 7.

A projection 5 for preventing a fall of a source material 4 is formed on the inner wall of the crystal growth container 1 at a proper distance from the upper surface of the heat sink 7.

Thereafter, a Se—Te mixture having a predetermined composition as a solvent 6 and ZnSe polycrystal as a source material (crystal) 4 are loaded in the crystal growth container 1. The quantity of the solvent 6 is set so that it completely covers the seed crystal 2 and source material 4.

The source material 4 is supported by the projection or source material support jig 5. A distance between the seed crystal 2 and source material 4 is preferably 20 mm to 80 mm or it is optimum to set to 40 mm to 60 mm. The source material 4 is disposed facing the seed crystal 2 and has preferably a disk shape so as to facilitate the support thereof.

The crystal growth container 1 shown in FIG. 3A has the projection for preventing the fall of the source material 4. The fall of the source material 4 may be prevented by other means. For example, a quartz tube having a diameter larger than that of the quartz tube where the solvent is filled, is connected to the latter quartz tube, and a source material of a disk shape having a diameter nearly the same as that of the former quartz tube is used. A step between the two quartz tubes can prevent the fall of the source material.

The crystal growth container 1 accommodating the source material 4, solvent 6 and seed crystal 2 in the above manner is connected to a vacuum pump to evacuate the inside of the container 1 to a vacuum degree higher than $2 \times 10^{-6}$ Torr, and thereafter the open end of the container 1 is hermetically sealed.

The crystal growth container 1 is turned laterally or upside down to dissolve (melt) the solvent. The seed crystal 2 does not contact the solvent, and only the source material 4 contacts the solvent. In this state, the solvent is saturated by the solute to form a saturated solution. A saturated solution is prepared at a growth temperature by setting the solvent to this growth temperature. Thereafter, the crystal growth container is turned upright. Since the solvent is a saturated solution, dissolution of the seed crystal can be suppressed to a very low level.

The crystal growth container 1 thus prepared is placed in an electric furnace having a temperature distribution shown in the left side in FIG. 3A.

The source material 4 in the high temperature area is dissolved in the solvent 6 up to a saturation solubility in the high temperature area. Source material components dissolved in the solvent 6 move also to the low temperature area through diffusion so that the solution in the low temperature area has a supersaturated state.

As the seed crystal 2 comes in contact with the supersaturated solution, a bulk single crystal is grown on the seed crystal. In this case, the crystal is grown along the tapered surface of the seed crystal fixer 3 and along the inner wall of the crystal growth container 1, and the grown crystal gradually increases in diameter. The grown crystal having a diameter larger than that of the seed crystal 2 can be obtained.

FIG. 3B is a cross sectional view showing another example of a crystal growth container 1a. A quartz tube 1c having a smaller diameter and a quartz tube 1e having a larger diameter are connected by a horn-shaped quartz tube 1d having one cut end with a diameter equal to that of the quartz tube 1c and the other cut end with a diameter equal to that of the quartz tube 1e. An angle between the slanted surface of the horn-shaped quartz tube 1d and a plane perpendicular to the center axis of the tube 1d is preferably in a range from an angle of 60° to an angle smaller than 90°, or it is optimum to set it in a range from an angle of 70° to an angle smaller than 80°.

The quartz tube 1c and the smaller diameter cut end of the quartz tube 1d, as well as the quartz tube 1e and the larger diameter cut end of the quartz tube 1d, are smoothly coupled to form the crystal growth container 1a. A projection 5 for preventing the fall of a source material is formed on the inner wall of the crystal quartz container 1e at a proper height position.

A heat sink 7 is housed in the smaller diameter region of the crystal growth container 1a, and a seed crystal 2 is placed on the upper surface of the heat sink 7. The seed crystal 2 is a ZnSe single crystal which is the same as that used with the container 1 shown in FIG. 3A, and has a diameter nearly equal to the inner diameter of the quartz tube 1c.

Next, a horn-shaped seed crystal fixer 3a is inserted into and fixed to the quartz tube 1d to thereby fix the seed crystal 2, the fixer 3a having the outer surface conformal to the inner surface of the quartz tube 1d. Similar to the inner surface of the quartz tube 1d, the inner surface of the seed crystal fixer 3a has an inclination angle of 60° to 90°, or preferably 70° to 80°, relative to the plane perpendicular to the center axis of the quartz tube 1d.

Similar to the container 1 shown in FIG. 3A, solvent 6 and a source material 4 are loaded in the container 1a which is then evacuated and hermetically sealed for crystal growth. In this case, a crystal is grown along the inner surfaces of the seed crystal fixer 3a and quartz tubes 1d and 1e, so that a crystal having a diameter larger than that of the seed crystal 2 can be obtained.

The solution crystal growth can lower the growth temperature. However, if a vapor pressure of solvent is high, the high temperature crystal growth becomes difficult. As the growth temperature lowers, the growth speed lowers.

After the crystal growth, the temperature of the solution is lowered and the crystal growth container is cracked or destroyed to pick up the grown crystal. In most cases, the used solution is dumped so that material cost rises.

Although the diameter of the grown crystal becomes large by growing the crystal having a tapered region along the growth direction, nuclei are likely to be generated in the tapered region so that it is not easy to grow a single crystal with good reproductivity.

SUMMARY OF THE INVENTION

It is an object of the present invention to provide a crystal growth method and apparatus capable of easily forming a crystal having a diameter larger than that of a seed crystal.

It is another object of the present invention to provide a crystal growth method and apparatus capable of lowering a material cost for crystal growth.

It is still another object of the present invention to provide a crystal growth method and apparatus capable of forming a crystal at high growth speed.

According to one aspect of the present invention, there is provided a crystal growth method comprising the steps of: preparing a growth container having a vapor generating chamber provided with a source material, a growth chamber provided with a seed crystal, and a coupling portion having a cross sectional area narrower than a cross sectional area of each of the vapor generating chamber and the growth chamber, the coupling portion coupling the vapor generating chamber and the growth chamber; and vapor-phase growing a single crystal on the seed crystal by forming a temperature gradient in the growth container and by maintaining the seed crystal in the growth chamber at a growth temperature and the source material in the vapor generating chamber at a vapor supply temperature higher than the growth temperature.

According to a further aspect of the invention, there is provided a crystal growth apparatus comprising: a growth container having a vapor generating chamber provided with a source material, a growth chamber provided with a seed crystal, and a coupling portion having a cross sectional area narrower than a cross sectional area of each of the vapor generating chamber and the growth chamber, the coupling portion coupling the vapor generating chamber and the growth chamber; and a furnace for forming a temperature gradient in the growth container.

A crystal is grown not only on the upper surface of a seed crystal but also on the side surface of the seed crystal so that a crystal having a diameter larger than that of the seed crystal can be grown.

Since a solvent is not used, the crystal growth is not limited by the vapor pressure of solvent and a crystal growth temperature can be raised.

The bottom surface of a growth container is worked to have a flat mirror surface on which a tubular side wall is formed. Without using a tapered surface, a crystal having a diameter larger than that of a seed crystal can be grown on the seed crystal.

Since a solvent is not used, material cost can be lowered.

Since a solvent is not used, only a vapor pressure of a substance for crystal growth is taken into consideration. If a group II–VI compound semiconductor is used, a growth temperature can be set higher than that used for solution crystal growth.

BRIEF DESCRIPTION OF THE DRAWINGS

FIG. 1 is a cross sectional view and a graph, illustrating a crystal growth apparatus and method according to an embodiment of the invention.

FIG. 2 is a graph showing experiment results.

FIGS. 3A and 3B are cross sectional views and a graph, illustrating a crystal growth apparatuses and methods according to conventional techniques.

DETAILED DESCRIPTION OF THE PREFERRED EMBODIMENTS

An embodiment of the invention will be described with reference to the accompanying drawings. Growing a group II–VI compound semiconductor ZnSe will be described only for illustrative purpose and in no limitative sense.

FIG. 1 is a cross sectional view of a crystal growth apparatus according to an embodiment of the invention, and a graph showing a temperature distribution in the crystal growth apparatus. In the crystal growth apparatus shown in the left side in FIG. 1, a quartz ampule 11 providing a growth chamber GC is placed in an inner space of a furnace 10. The lower region of the quartz ampule 11 constitutes a quartz heat sink 17. The upper surface of the quartz heat sink 17 is worked to have a flat mirror surface on which a seed crystal 12 of a ZnSe single crystal is placed.

A space over the seed crystal 12 forms a growth chamber GC. A quartz spacer 18 is disposed over the growth chamber GC. The outer diameter of the quartz spacer 18 is slightly smaller than the inner diameter of the quartz ampule 11 so that a slit is formed between the quartz ampule 11 and quartz spacer 18 allowing gas to flow therethrough.

For example, the cross sectional area of the slit is 1/10 the inner cross sectional area of the quartz ampule, or smaller. The quartz spacer 18 is supported on a projection formed on the inner wall of the quartz ampule 11 or directly supported by the quartz ampule 11 by partially melting the quartz spacer 18 to adhere it to the quartz ampule 11.

A source material (crystal) 14 is placed on the quartz spacer 18, the source material being a polycrystal ZnSe formed by CVD. The space surrounded by the source material 14 on the quartz spacer 18 and the quartz ampule 11 constitutes a vapor generating chamber VC. Ar gas is filled in the quartz ampule 11 at a pressure of 4.7 to 15.7 Torr at room temperature (0.006 to 0.03 atm). The temperature in a quartz ampule 11 is raised during the crystal growth so that the Ar pressure rises.

The growth container prepared as above is placed in the furnace 10. The furnace 10 is then heated to form a temperature gradient shown in the right side in FIG. 1. For example, the source temperature Ts at the lower surface of the source material 14 is in a range from 1100° C. to 1200° C. A growth temperature Tg at the position where the seed crystal 12 is placed is in a range from 1050° C. to 1180° C. A temperature difference ΔT between the source temperature and growth temperature is in a range from 20° C. to 50° C.

It was difficult for the apparatus used for experiments to control the temperature difference ΔT between the source temperature and growth temperature to be precisely at 20° C. and the temperature distribution was disturbed. The growth temperature Tg confirmed during experiments was in a range from 1050° C. to 1170° C. and the temperature difference ΔT was in a range from 30° C. to 50° C.

With such a temperature gradient being formed, vapor of the source material 14 is generated and supplied to the growth chamber GC via the slit between the quartz spacer 18 and quartz ampule 11. The vapor of the source material 14 is solidified on the surface of the seed crystal 12 and a crystal is grown on the exposed surface of the seed crystal 12.

Crystal growth occurs not only on the upper surface of the seed crystal 12 but also on the side surface thereof. Since the upper surface of the quartz heat sink 17 is the flat mirror surface, crystal growth does not occur on the surface of the quartz heat sink 17. As the crystal growth progresses, the crystal grown on the seed crystal 12 eventually occupies the whole inner diameter of the quartz ampule 11, and a cylindrical crystal is grown.

The processes of manufacturing a growth container shown in FIG. 1 will be described. A quartz tube having a diameter of 8 mm to 50 mm is first prepared. The quartz heat sink 17 is connected to the bottom of the quartz tube. The upper surface of the quartz heat sink 17 is worked previously to have a flat mirror surface. The growth container with its upper open end is prepared in the above manner. This growth container is etched with hydrofluoric acid and washed with acid to clean the surface thereof.

As the seed crystal 12, a ZnSe single crystal is prepared having an outer diameter smaller than the inner diameter of the growth container. For example, a disk type single crystal is prepared. It is desired that the upper surface of the seed crystal 12 has the plane (1 1 1). The surface of the seed crystal 12 is polished to have a mirror surface and thereafter organic washing and mirror surface etching are performed.

In addition to the growth container, a quartz rod is prepared which has a length of about 20 mm and an outer diameter shorter by about 0.5 mm to 1 mm than the inner diameter of the growth container. This quartz rod is subjected to the processes similar to those of the growth container to thereby prepare the quartz spacer 18.

The seed crystal 12 is placed on the bottom surface of the growth container, i.e., on the central upper surface of the quartz heat sink 17. Next, the quartz spacer 18 is inserted down into the growth container and fixed to the higher position of the quartz container. A source material 14 is placed on the spacer 18.

The inside of the growth container is evacuated via the upper open end to a vacuum degree of $1\times10^{-6}$ Torr or higher (lower pressure), and thereafter argon gas is introduced to a predetermined pressure and the upper open end of the quartz container is heated to hermetically seal the quartz container. The pressure of the introduced argon gas is regulated, for example, to 4.7 Torr to 15.7 Torr at room temperature.

The furnace 10 shown in the left side in FIG. 1 is heated to form a temperature gradient shown in the right side in FIG. 1. For the crystal growth, the growth ampule manufactured by the above method is inserted into the furnace having such a vertical temperature gradient.

It has been found from the experiments that a single crystal can be grown on the seed crystal 12 by properly selecting the temperature difference ΔT between the source material and seed crystal and the introduced argon pressure $P_{Ar}$.

FIG. 2 is a graph showing relation of a growth speed to the temperature difference ΔT between the source material and seed crystal and the argon pressure $P_{Ar}$. The argon pressure $P_{Ar}$ was set to various values in a range from 0 atm (no argon pressure) to 1 atm.

In a range g1 having a growth speed from 20 mg/h·cm$^2$ to 60 mg/h·cm$^2$, a single crystal was grown reliably. In a range g4 having a temperature difference ΔT of 20° C., the crystal growth was somewhat unstable and a twin crystal or a polycrystal was formed in some case. The crystal growth at ΔT=20° C. is supposed to have a large dependency upon the crystal growth apparatus. It is expected that a good single crystal can be grown even at ΔT=20° C., if the growth apparatus having linear curves of Ar pressures of 0.03 atm and 0.05 atm in a ΔT range from 20° C. to 60° C. is manufactured.

At the growth speed faster than 60 mg/h·cm$^2$, grain boundaries were formed in some case and there was a tendency of easy to polycrystallize. More specifically, in a range g2, a single crystal containing a twin crystal was formed, and in a range g3 a polycrystal was formed. At the growth speed slower than 20 mg/h·cm$^2$, although a single crystal only with inclusions was formed, the growth speed is too slow and impractical. In a region g6 with a very slow growth speed, crystal growth in blocks was likely to occur.

A single crystal having the crystal plane reflecting the plane of the seed crystal was formed easily under the conditions that the argon pressure $P_{Ar}$ of 0.03 atm to 0.1 atm and the temperature difference ΔT of 30° C. to 50° C. between the seed crystal and source material.

The growth temperature Tg was 1050° C. to 1170° C. which is higher than that for the solution crystal growth using a solvent. Since solvent is not used, it is not necessary to take the vapor pressure of the solvent into consideration. It was possible to raise the growth temperature without increasing a resistance to pressure of the growth container. The growth speed under the above-described conditions took about a three- to seven-fold of that for the solution crystal growth.

It is desired that the seed crystal 12 has an outer diameter about ½ the inner diameter of the quartz ampule 11, or larger. If the outer diameter of the seed crystal 12 is too small, grain boundaries are likely to be formed and polycrystal becomes easy to be formed. It is therefore preferable that a ratio $R_D$ of the outer diameter of the seed crystal to the inner diameter of the ampule is 0.5 to 1. If this ratio $R_D$ of the outer diameter of the seed crystal to the ampule inner diameter is 0.5, a crystal having a diameter twice as that of the seed crystal can be formed.

Since a crystal is grown along the inner wall of the quartz ampule 11, it has a cylindrical shape. Since the tapered surface is not formed, a disk shape crystal wafer can be cut out of the grown crystal without any material loss.

With the above manufacture method, a solvent is not used and the growth container is of a vertical type. The seed crystal 12 is therefore placed on the heat sink without using any fixing means. Since the upper surface of the heat sink is a flat surface, mirror polishing is easy. Since the seed crystal 12 is simply placed on the flat upper surface of the heat sink 17, thermal stress to be caused by a difference between thermal expansion coefficients is not applied to the seed crystal 12. Therefore, distortion to be caused by a temperature rise is not applied to the seed crystal 12.

After the crystal growth, the temperature of the growth container is lowered to pick up the grown crystal. In this case, the grown crystal can be easily picked up even if the source material is left, because there is no solvent which may be solidified. Material waste can therefore be reduced and the material cost can be lowered.

The crystal growth has been described above by taking as an example ZnSe. It is obvious to those skilled in the art that similar methods can be applied to the crystal growth of a substance having a high vapor pressure at a high temperature, particularly near at the melting point. For example, it can be expected that the crystal growth of a group III–V compound semiconductor and a group II–VI compound semiconductor can be performed by similar methods. The crystal growth of a group II–VI compound semiconductor is particularly suitable.

Ar gas is introduced into the growth container in the above embodiment. Other inert gases may also be used. Even if inert gas is not introduced, similar vapor growth may be performed.

Although the ampule, heat sink, and spacer are all made of quartz, other materials may also be used if they do not react with a substance for crystal growth and are resistant to the growth temperature.

The present invention has been described in connection with the preferred embodiments. The invention is not limited only to the above embodiments. It is apparent that various modifications, improvements, combinations, and the like can be made by those skilled in the art.

What is claimed is:

1. A crystal growth apparatus which comprises
   a growth container having a vapor generating chamber provided with a source material, a growth chamber provided with a seed crystal, and a coupling portion having a cross sectional area narrower than a cross sectional area of each of the vapor generating chamber and the growth chamber, the coupling portion coupling the vapor generating chamber and the growth chamber, a bottom surface of said growth chamber on which the seed crystal is placed has a flat mirror surface broader than a bottom surface of the seed crystal;
   a furnace for forming a temperature gradient in said growth container; and
   a quartz spacer disposed over the growth chamber, the quartz spacer having an outer diameter which is smaller than an inner diameter of the growth chamber so that a slit is formed between the growth chamber and the quartz spacer to allow gas to flow therethrough.

2. A crystal growth apparatus according to claim 1, wherein said growth container is filled with inert gas at a pressure from 0.03 atm to 0.1 atm at a growth temperature.

3. A crystal growth apparatus according to claim 1, wherein the growth container is made of quartz.

* * * * *